United States Patent
Baks (10) Patent No.: US 8,174,877 B2
(45) Date of Patent: May 8, 2012

(54) ELECTRIC DEVICE COMPRISING PHASE CHANGE MATERIAL AND HEATING ELEMENT

(75) Inventor: Wilko Baks, Nuenen (NL)

(73) Assignee: NXP B.V., Eindhoven (NL)

( * ) Notice: Subject to any disclaimer, the term of this patent is extended or adjusted under 35 U.S.C. 154(b) by 227 days.

(21) Appl. No.: 12/666,816

(22) PCT Filed: Jun. 20, 2008

(86) PCT No.: PCT/IB2008/052442
§ 371 (c)(1),
(2), (4) Date: Dec. 28, 2009

(87) PCT Pub. No.: WO2009/001262
PCT Pub. Date: Dec. 31, 2008

(65) Prior Publication Data
US 2010/0188892 A1      Jul. 29, 2010

(30) Foreign Application Priority Data
Jun. 28, 2007   (EP) ..................................... 07111223

(51) Int. Cl.
*G11C 11/00* (2006.01)
*G11C 7/00* (2006.01)
*H01L 21/02* (2006.01)

(52) U.S. Cl. .............. 365/163; 365/189.16; 365/189.15; 365/148; 438/382; 257/E21.004

(58) Field of Classification Search .......................... None
See application file for complete search history.

(56) References Cited

U.S. PATENT DOCUMENTS

| | | | |
|---|---|---|---|
| 5,933,365 A | 8/1999 | Klersy et al. | |
| 6,496,407 B2* | 12/2002 | Ashikaga | 365/145 |
| 2004/0151024 A1 | 8/2004 | Fricke et al. | |
| 2005/0242338 A1 | 11/2005 | Hart et al. | |
| 2006/0091492 A1 | 5/2006 | Lee et al. | |
| 2006/0092694 A1 | 5/2006 | Choi et al. | |
| 2006/0203430 A1* | 9/2006 | Pinnow et al. | 361/528 |
| 2007/0099405 A1 | 5/2007 | Oliva et al. | |
| 2007/0235708 A1* | 10/2007 | Elmegreen et al. | 257/3 |

FOREIGN PATENT DOCUMENTS

| | | |
|---|---|---|
| JP | 005093619 A | 7/2005 |
| WO | 04057618 | 8/2004 |

* cited by examiner

*Primary Examiner* — Hoai V Ho
*Assistant Examiner* — James G Norman (57) ABSTRACT

An electric device has a resistor including a phase change material changeable between a first phase and a second phase within a switching zone. The resistor has a first resistance when the phase change material is in the first phase and a different second resistance, when the phase change material is in the second phase. The resistor may conduct a first current. The device has a heating element that may conduct a second current for enabling a transition of the phase change material from the first to the second phase. At the position of the switching zone, the resistor is arranged as a first line and the heating element is arranged as a second line. The first and second line may conduct the first current and the second current respectively, wherein the first line and the second line cross at the position of the switching zone.

17 Claims, 4 Drawing Sheets

Prior Art

ELECTRIC DEVICE COMPRISING PHASE CHANGE MATERIAL AND HEATING ELEMENT

FIELD OF THE INVENTION

The invention relates to an electric device comprising a resistor comprising a phase change material being changeable between a first phase and a second phase within a switching zone, the resistor having a first electrical resistance when the phase change material is in the first phase and a second electrical resistance, different from the first electrical resistance, when the phase change material is in the second phase, the resistor being capable of conducting a first current and the device having a heating element being able to conduct a second current for enabling a transition of the phase change material from the first phase to the second phase within the switching zone of the resistor.

The invention also relates to a memory device comprising such an electric device, as well as an addressing method for programming such a memory device and an addressing method for reading such a memory device.

The invention also relates to a semiconductor device comprising such a memory device.

BACKGROUND OF THE INVENTION

Various concepts of electronic memory applications based on a phase change material (PCM) that has a different resistivity in its crystalline and amorphous states, and which can be electrically switched between these states, have been proposed. E.g., in U.S. Pat. No. 5,933,365, structures have been proposed where a phase change material is applied in a top-hole or a via-hole, i.e., conducting a current in the vertical direction, and contacting via one or more intermediate layers to metallic conductors (electrodes) above and below the phase change material via. Also, it is disclosed to apply pulse schemes to switch from the low resistivity state to the high resistivity state or vice versa. Also, a heating layer can be applied in series with the phase change material to better control the heating of the phase change volume and its environment.

An alternative structure is disclosed in WO04057618, where the phase change material is deposited as a line, i.e. in-plane, typically in a horizontal direction (in a plane parallel to that of the substrate), connecting to the electrodes at a distance away from the switching region of the PCM line. In these line concepts, the line of PCM is heated by sending a current through the (narrow) line. Depending on the amount of heating and the rate at which the PCM cools down, a part of the PCM within the line, called the switching zone, will transform from amorphous to crystalline or vice versa. As these phases are stable with time, the corresponding different resistance values of the crystalline and amorphous phases can be used for memory application. Measuring the resistance by sending a small readout current through the line does readout.

The above mentioned document also discloses a heater element that is connected electrically parallel to the phase change material, a.o., to be less susceptive to the difference in resistance of the PCM resistor during programming.

These memories can be used as (embedded) flash floating gate memories which are programmed and erased many times and keep their information even when the power supply is off, they can also be used as (embedded) SRAM and/or DRAM, as soon as its electrical, thermal and physical properties allow for it, i.e. when programming voltages and dissipated power are sufficiently low, and the endurance is sufficiently good to accommodate a large number of programming cycles while maintaining good performance. The line concept is especially attractive, as structures using this concept may be relatively easy to manufacture and can in principle be well scaled to small dimensions of memory element as a whole, and of the switching part of the phase change volume in particular.

WO2004/057618 discloses an embodiment of an electric device having a resistor a resistor comprising a phase change material being changeable or transformable between a first, e.g. crystalline, phase and a second, e.g. amorphous, phase within a switching zone, the resistor having a first electrical resistance when the phase change material is in the first phase and a second electrical resistance, different from the first electrical resistance, when the phase change material is in the second phase, the phase change material constituting a conductive path between a first contact area and a second contact area, a cross-section of the conductive path being smaller than the first contact area and the second contact area, resembling a so-called "dog bone" structure. The electric device further comprises a heating element able to conduct an electrical current for enabling a transition from the first phase to the second phase. The first phase and/or the second phase may be partially amorphous and partially crystalline. In the remainder the terms "crystalline" and "amorphous" are used to refer to a crystalline phase or a mainly crystalline phase, and to an amorphous phase or a mainly amorphous phase, respectively.

The resistor is electrically connected to a first conductor and a second conductor in such a way that its electrical resistance value can be measured. A transition from a crystalline phase with a relatively good electric conductivity to a amorphous phase with a relatively poor conductivity, requires sufficiently strong heating to melt the phase change material. When the heating ends, the phase change material cools down and when this occurs fast enough assumes a more amorphous phase.

When the heat input is sufficiently high to increase the temperature of the phase change material to above its crystallization temperature, when amorphous, a phase transition from the low conductivity phase to the high conductivity crystalline phase can occur.

The "dog bone" structure of the lines of memory material, as disclosed in WO2004/057618, serves to improve endurance. In the "dog bone" structure, the volume of phase change material in the line shaped part has a larger electrical resistance than the electrical contact resistance at the first and/or the second contact areas, independent of whether the phase change material is in the first or second phase. In such a device, Joule heating at the first contact area and/or at the second contact area is smaller than the Joule heating inside the volume of phase change material in the line shape part where the current density is high. This reduces the interaction between the phase change material and the other materials at the first and/or second contact areas, leading to an improved endurance compared to a structure without the "dog bone" structure. Moreover, the electrical power is dissipated, i.e. converted to heat, mainly at the position where the phase change occurs. By reducing the dissipation at positions where the phase change does not occur the total electrical power required for inducing a phase transition is reduced.

The heating can be achieved by passing an electric current through the phase change material, and/or through a heating element in thermal contact to the phase change material. In In WO2004/057618, the heating element is arranged to be electrically parallel with the resistor, such that the phase transitions in the phase change material are generated by its own resistive heating and the heat generated by the resistive heating of the heater. In U.S. Pat. No. 5,933,365 the heating layers are connected in series with the resistor (in fact they also constitute the contact between the phase change layer and the electrical contacts), and they heat the resistor by Joule heating. The heating layers can be thin-film structures deposited adjacent to the phase change material.

The heating can be achieved by passing an electric current through the phase change material, and/or through a heating element in thermal contact to the phase change material. In WO2005/057618, the heating element is arranged to be electrically parallel with the resistor, such that the phase transitions in the phase change material are generated by its own resistive heating and the heat generated by the resistive heating of the heater. In U.S. Pat. No. 5,933,365 the heating layers are connected in series with the resistor (in fact they also constitute the contact between the phase change layer and the electrical contacts), and they heat the resistor by Joule heating. The heating layers can be thin-film structures deposited adjacent to the phase change material.

The known electric device is an electrically writable and erasable memory cell, which carries information encrypted in the value of the electrical resistance. The memory cell is assigned, e.g. a "0" when the resistance is relatively low and a "1" when the resistance is relatively high. The resistance may be easily measured by supplying a voltage across the resistor and measuring the corresponding current. The memory element is written and erased by inducing a transition from a first phase to a second phase as described above.

It is observed that an electric device as described above deteriorates when repeatedly switched between the first phase and the second phase, i.e., the lifetime, also called life span or endurance, of the electric device is limited. The inventors have recognized that the origin of this lies in the physical structure and the thermal properties of the prior art structures.

SUMMARY OF THE INVENTION

It is an object of the invention to provide an electric device as described in the opening paragraph in which the functionality of the electric device is improved in comparison with the device from the prior art.

Hereto the electric device according to the present invention is characterised in that, the resistor is arranged as a first line and the heating element is arranged as a second line, the first line being adapted to conduct the first current and the second line being adapted to conduct the second current, wherein the first line and the second line cross at a cross position of the switching zone. In effect, the high programming current does not run through the interface between the phase change material and the electrode interface, whereby delamination and segregation is much reduced. Moreover, in the electric device the heated volume is well defined by the crossing area of the heater and the phase change resistor. This allows the heated volume to be smaller, with the advantageous effect that the power needed for the phase change transition is lowered and the size of the heated volume around the phase change material can be reduced. Also the heat will sink more towards the perpendicular heater instead of via the phase change lines, resulting in a lower electrode temperature, which further limits delamination and segregation of the PCM electrodes improving a read-out procedure.

In one embodiment, the first line and the second line are electrically isolated from each other.

In another embodiment, the heater as well as the phase change resistor is preferably a "dog bone" shaped line structure, with their crossing position in the narrow regions of both "dog bone" parts. The broad ends provide good thermal and low-resistive electrical contact to their electrodes.

The heater may be above or below the phase change resistor material.

The heater may be in direct contact with the phase change resistor, or be separated from it with an intermediate layer, such as a dielectric insulator layer, to reduce, and preferably, prevent mixing of the phase change material with the electric heater material.

The heater may be arranged electrically in series, or electrically parallel with the phase change resistor.

In a preferred embodiment, the heater and phase change resistor constitute independent current paths.

In another embodiment of the invention, the heating element is composed of at least two layers. The first layer of the at least two layers is positioned between the second layer of the at least two layers and the phase change material. This first layer transfers the heat generated in the second layer to the phase change layer. The first layer is an insulator with a sufficiently high electrical isolation, and is preferably composed of undoped silicon. The second layer has a sufficiently high thermal and a sufficiently high electrical conductivity, and is preferably composed of a silicide compound, or even more preferably of salicided undoped silicon. This isolates the second layer electrically from the phase change layer, while keeping good thermal contact. As a result, the high-power programming path through the second layer of the heater is well isolated from the phase change layer, and it can be optimized separately from the reading part. Moreover, parasitical leakage via the heater to the PCM material is much less, such that no area-consuming design solutions are needed. Additionally, the much better heat transfer (approximately a factor ten to hundred) of silicon compared to a $SiO_2$ dielectric results in a much lower power consumption. As a beneficial side-effect, the structure also allows to form an extremely thin heater layer, as the salicidation process is well controlled. A thin heater has the benefit of enhanced current density and therefore increased Joule heating at a given current.

The present invention also relates to a memory device comprising such an electric device. In one embodiment, the memory elements of the memory device comprises transistor switches, such as metal oxide semiconductor field effect transistors (MOSFETs), and the memory elements are addressed using N first selection lines (also called 'rows'), M second selection lines (also called 'bitlines or columns') and an output line. The resistor of each memory element electrically connects one of the (source or drain) terminals from the MOSFET to the output line, while the other terminal is electrically connected to one of the M second selection lines, or column lines. The gate region of the MOSFET is electrically connected to one of the N first selection lines, or row selection lines. The resistor has a heater connected electrically in parallel with the phase change material. This allows reading and writing the individual N×M memory elements.

An alternative embodiment of a memory device according to the present invention relates to an addressable matrix that is made without the use of transistors in the memory cell. The memory elements are addressed using N first selection lines, M second selection lines, N third selection lines and M fourth selection lines. All M memory elements on the same first selection line are written or read simultaneously. This is called line-at-a-time operation. The resistor of each memory element electrically connects one of the N first selection lines to one of the M second selection lines. The heater of each memory element electrically connects one of the N third selection lines to one of the M fourth selection lines.

For programming a memory element, the first and second selection line for the corresponding memory element are kept floating, the third selection line for the corresponding memory element is kept at zero voltage or grounded, and the memory element is written with its corresponding data by the appropriate programming voltage Vp (for writing) or erase voltage Ve (for erasing) on the fourth selection lines for the corresponding memory element. The other N−1 first selection lines and the other N−1 third selection lines are kept floating.

For reading a memory element, the second selection line for the corresponding memory element is set at the readout voltage Vr and the first selection line for the corresponding memory element is kept at zero voltage or grounded. The corresponding third selection lines and the corresponding fourth selection line are kept floating. The other N−1 first selection lines and the other N−1 third selection lines are kept floating.

The present invention also relates to a semiconductor device comprising such a memory device. The semiconductor device can, e.g., also comprise other semiconductor structures with other functions, such as an arithmetic unit constructed from CMOS logic transistors.

The present invention also relates to a method of manufacturing such a semiconductor device. The other semiconductor structures with other functions are constructed directly on the (silicon) substrate, e.g., a single-crystal p-doped silicon semiconductor wafer, which is known as the front-end process. This is done in a sequence of steps of applying layers of material, possibly doping these layers and patterning these layers, in which transistor regions as well as connections between the different regions of the transistors are applied. After the front-end process is finished, further layers only comprising layers of insulator material and conductor material, typically metal, are applied to form a connectivity structure between the different elements on the semiconductor device and to form connectivity elements to the outside world, such as the pads of the semiconductor device. This is known as the back-end process.

In one embodiment, the phase change resistor, the heater, the grid of first and second selection lines, the output line and the MOSFETs forming the selection devices as described above, are at least partly formed in these front-end process layers, together with the other semiconductor structures, such as the arithmetic units.

In another embodiment, the phase change resistor, the heater, the grid of first, second, third and fourth selection lines, as described above, are at least partly formed in these front-end process layers, together with the other semiconductor structures, such as the arithmetic units.

In a further embodiment, the other semiconductor structures are formed in the these front-end process layers, whereas the phase change resistor, the heater, the grid of first, second, third and fourth selection lines as described above, are formed in the back-end process layers. The CMOS logic transistors are placed underneath the memory elements, giving a considerable gain in area efficiency compared to the aforementioned MOSFET addressing method, where the MOSFETs addressing the memory device take the major area of the front-end of the semiconductor device. In fact, the whole front-end is now used for the other semiconductor structures, and the memory device does not take part of the front-end area. The phase change memory unit can thus be added to many standard CMOS products as a module in the back-end process.

BRIEF DESCRIPTION OF THE DRAWINGS

These and other aspects of the invention will be further elucidated and described with reference to the drawings, in which.

DESCRIPTION OF EMBODIMENTS

Figure 1A:
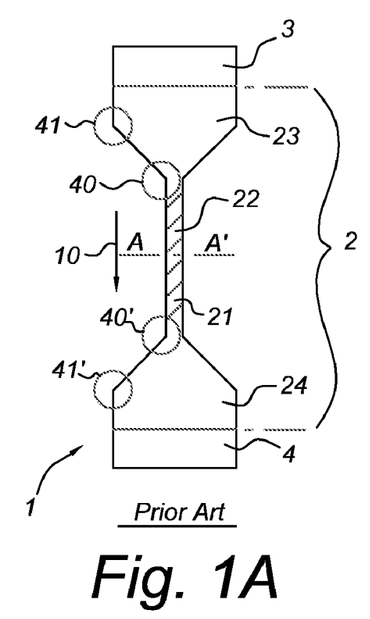
FIG. 1A shows a resistor in a "dog bone" shape of the lines according to the prior art.

FIG. 1A shows a prior art resistor 1 which comprises a phase change material section 2, which is connected to the rest of the electric device via an electrode 3 and a counter electrode 4. A current path denoted by arrow 10 runs from the electrode 3 through the phase change material section 2 through electrode 4. The phase change material section 2 is deposited as a line on a substrate, such as a single crystal p-doped silicon semiconductor wafer. The phase change material is changeable between a first phase and a second phase. The resistor 1 has a first electrical resistance when the phase change material is in the first phase and a second electrical resistance, different from the first electrical resistance, when the phase change material is in the second phase. The phase change material section comprises a narrow part 21, which comprises a switching zone 22, and wide parts 23, 24. The wide parts 23, 24 connect the phase change material to the electrode 3 and the counter electrode 4, hereby creating low-resistive contact zones. The electrodes 3, 4 are further connected to further parts of a semiconductor device in which the resistor is embedded with, e.g., metal lines or vias (not shown), and may be connected to external contacts (not shown). Only a small class of materials can be used for these electrodes, as these need to have good adhesion properties to the phase change material section 2 and to the contact, line material or via material (usually a metal). Examples of such materials used in the prior art are TaN, TiW and TiN.

Figure 1B:
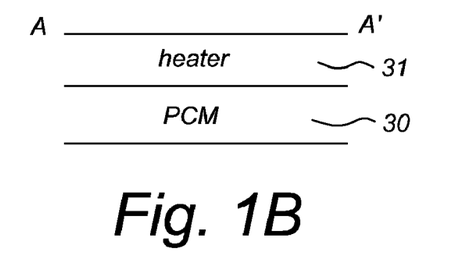
FIG. 1B shows a cross section of a heater concept according to the prior art.
Figure 1C:
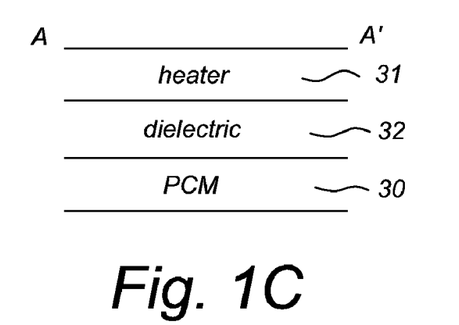
FIG. 1C shows a cross section of a heater concept with dielectric isolation according to the prior art.

A cross section A-A' of the switching zone is illustrated in FIG. 1B and FIG. 1C.

FIG. 1B shows the cross section A-A' of the switching zone. A heater layer 31 is deposited adjacent to the phase change material layer 30, e.g., as a line in a layer below or above the phase change material layer. The heating layer 31 and the phase change material layer 30 are in direct thermal and electrical contact.

FIG. 1C shows the cross section A-A' of the switching zone in an alternative structure. In this alternative structure, the heating layer 31 and the phase change material layer 30 are separated by a dielectric layer 32, which is of a sufficient thickness to electrically isolate the heating layer and the phase change material layer, while it is sufficiently thin to keep good thermal contact. The heating layer 31 and the phase change material layer 32 can be electrically parallel. When a high current is sent through the heating layer 31, the electrical power is converted to heat. This also heats the phase change material layer due to the good thermal contact between the heating layer 31 and the phase change material layer 32. Depending on the amount of heating, this results in a transition of the phase change material in the switching zone 22 from one state to the other. The process of getting the phase change material in a specific state is called programming of the device. E.g., when the temperature in the phase change material arises locally above the melting temperature, the phase change material comes into an amorphous state. E.g., when the temperature in the phase change material rises locally above the crystallization temperature, the phase change material changes from the amorphous state with a relatively poor conductivity into the crystalline state with a relatively high conductivity.

The level of current in the current path 10 is set to a relatively low level, Ir, which does not change the phase of the phase change material but flows through the phase change resistor 1 without significant heating. The resistance of the phase change resistor is then measured to detect the state of the phase change material. The relatively low resistance of the crystalline state is then used to denote a logical signal level, e.g., "0", and the relatively high resistance of the amorphous state is then used to denote another logical signal level, e.g., "1". The phase change resistor 1 can thus compose the memory function of a memory element.

When the phase change material is repeatedly switched between the amorphous and the crystalline state, the phase change material section 2 is repeatedly heated and cooled. The thermal gradients over the phase change material section 2 causes the material to degrade due to segregation and delamination, especially at positions 40, 40' and 41, 41', denoted in FIG. 1A. When the heating layer delaminates from the phase change layer, the thermal and electrical properties of the memory element deteriorate and adversely affect the number of times that the element can be reliably reprogrammed is reduced. After some number of times the memory element can no longer be reprogrammed. Moreover, the high current used for crystallization and amorphization runs though the interfaces between the phase change material section 2 and the electrodes 3, 4, and may cause the interfaces to degrade. E.g., the part of the phase change material section 2 that is in contact with the electrode 3, 4 gets amorphous regions while it needs to stay crystalline (which is the low-resistive state). The normal crystallization pulse will then not be able to re-crystallize these amorphous spots anymore. This also reduces the endurance of the device.

Figure 2:
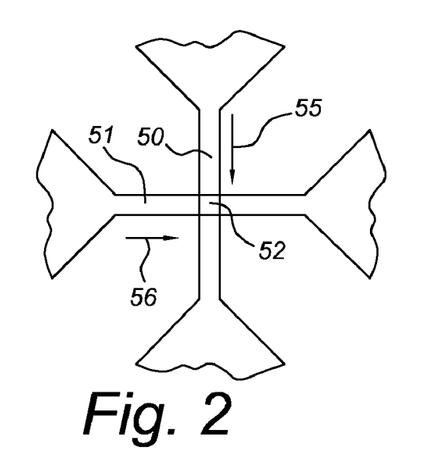
FIG. 2 shows a heater concept in an electric device according to the present invention.

FIG. 2 shows a top-view of an electric device according to the present invention. The phase change material (PCM) section is structured as a PCM line 50 in one plane essentially parallel to the substrate of the electric device. The heater section is structured as a heater line 51 in another plane essentially parallel to the substrate of the electric device. The PCM line 50 and the heater line 52 cross in a crossing zone 52. The PCM line and the heater line have a good thermal contact and a good electrical isolation in the crossing zone 52. A heater current shown by the arrow 56 is applied through the heater for heating the crossing zone 52, and by that the phase change material in the same zone. The crossing zone 52 thus defines the switching zone 22 of the phase change material line in a much better way than in a heater concept with the full heater line adjacent to the full phase change material line as in the prior art. The structure thus requires a lower amount of energy for the phase change transition and heats a smaller size of surrounding area than in prior art concepts, allowing a higher packing density of memory elements in the integrated device. This results in an attractive reduction of memory cost per stored bit. Moreover, the high programming current does not run through the PCM-electrode interface, thus keeping the interface clear from degradation. A phase change current shown by the arrow 55 may be applied through the PCM line 50 for reading the state of the PCM resistor by detecting its resistance.

Figure 3A:
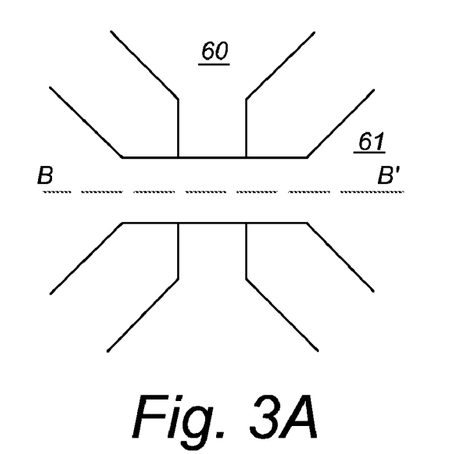
FIG. 3A-3D show embodiments of heater concepts according to the present invention

FIG. 3A shows an embodiment of the invention, where a first layer 60 is the phase change material layer and a second layer 61 is the heater layer, which over passes the phase change material layer. In an alternative embodiment, the phase change material layer may pass over the heater layer. Spacers may be used to improve the step coverage of the second layer 61 running over the first layer 60. The wider parts of the first layer 60 and the second layer 61 are only partially drawn and are optional. They are used as electrodes or the connecting parts of the layer material to the electrodes, and reduce the voltage drop and the heat loss over the whole device.

Figure 3B:
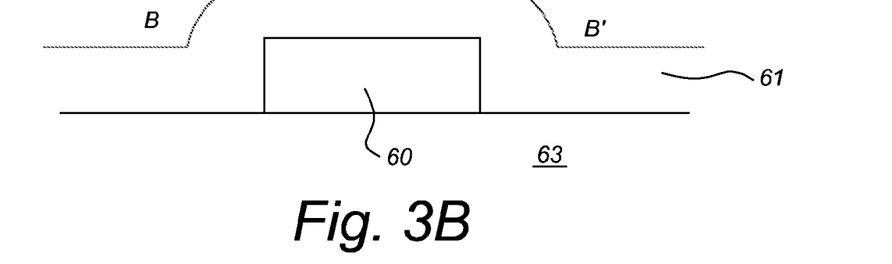

A cross section across the electric device according to one embodiment of the invention along the line B-B' is shown in FIG. 3B. The first layer 60 and the second layer 61 are in essentially different planes at the position of the crossing zone, but in essentially the same planes outside the crossing zone.

Figure 3C:
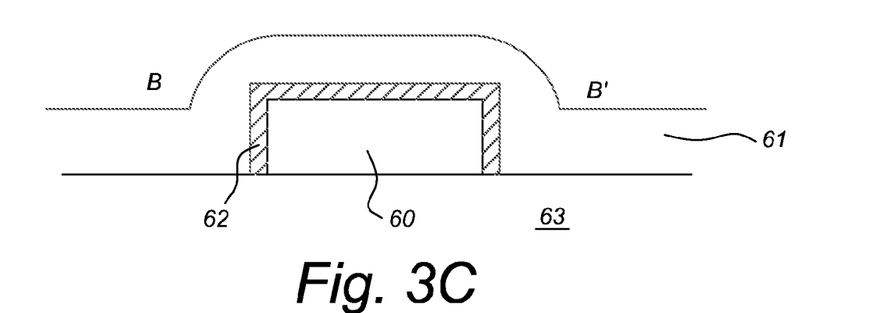

A cross section across the electric device according to another embodiment of the invention along the line B-B' is shown in FIG. 3C. The first layer 60 and the second layer 61 are electrically isolated from each other by an intermediate dielectric layer 62.

Figure 3D:
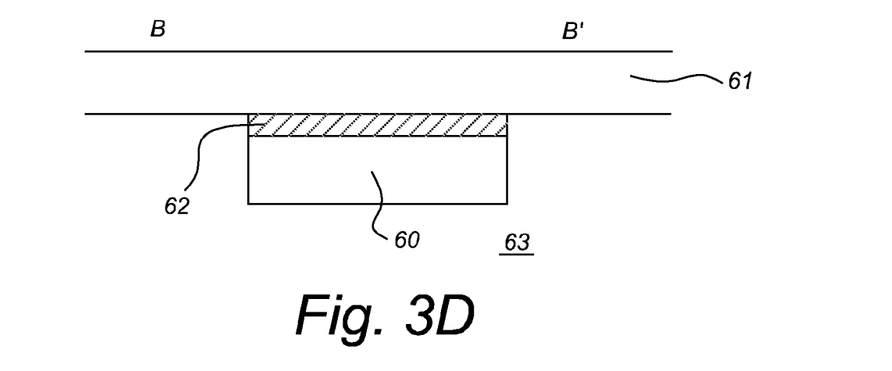

A cross section across the electric device according to yet another embodiment of the invention along the line B-B' is shown in FIG. 3D. The first layer 60 and the second layer 61 are in essentially different planes at the position of the crossing zone and also outside the crossing zone, e.g., sunken in the substrate 63.

Figure 4:
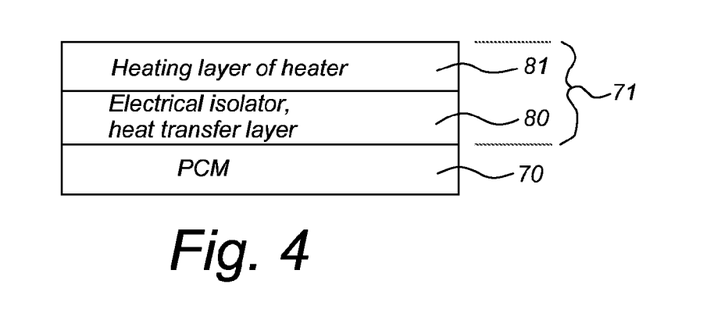
FIG. 4 shows a further embodiment of a heater concept according to the present invention.

FIG. 4 shows another embodiment of the invention. The electric device comprises a two-layer heater 71, which is compatible with the standard CMOS processing, and a phase change resistor 70. The heating element 71 is composed of two layers 80, 81. The first layer 80 of the heater is positioned between the second layer 81 of the heater and the phase change material 70. This first layer 80 has a good thermal conductivity and a good electrical isolation, and is preferably composed of undoped silicon. The second layer 81 has a good thermal and electrical conductivity, and is preferably composed of a silicide compound, or even more preferably of salicided undoped silicon. This isolates the second layer 81 electrically from the phase change layer 70, while keeping good thermal contact. As a result, the high-power programming path through the second layer 81 of the heater is well isolated from the phase change layer 70, and it can be optimized separately from the reading part. Moreover, parasitical leakage via the heater to the PCM material is much less likely to occur, such that no area-consuming design solutions are needed. Also, the much better heat transfer (approximately a factor hundred larger) of silicon compared to a $SiO_2$ dielectric results in much lower power consumption compared to the prior art devices where the heater is usually electrically isolated from the phase change material using such a dielectric layer. Adversely, the use of a dielectric layer results in high power consumption. The electrical isolation of a silicon layer is still acceptable, approximately $2.3 \cdot 10^5$ ohm·cm for undoped silicon compared to $10^{14}$ ohm·cm for a $SiO_2$ dielectric.

Moreover, such a two-layer heater as shown in FIG. 4 is easily integrated in the processing of semiconductor devices, whereas known devices have the disadvantage that the integration with other thin film elements can be cumbersome due to the use of non-standard materials, i.e., materials not used in the standard processing of semiconductor devices.

Figure 5:
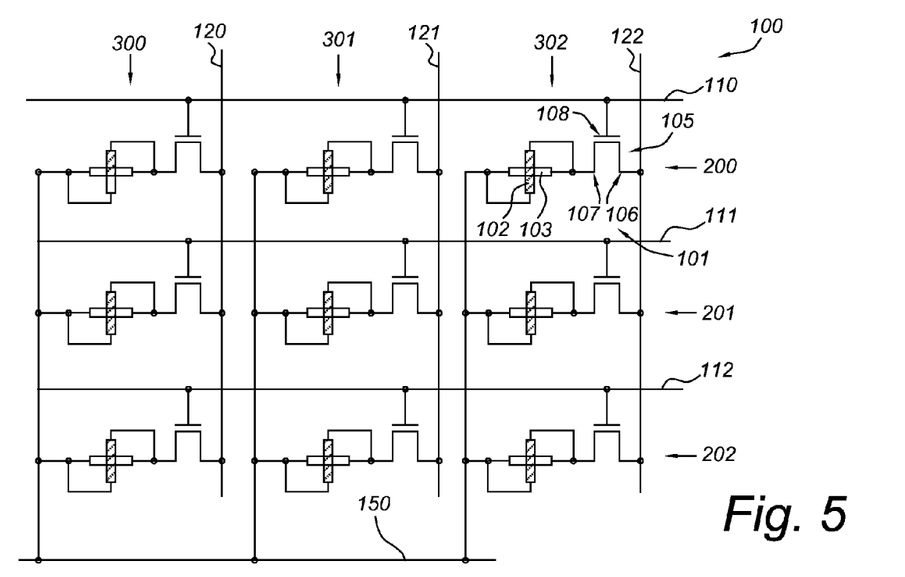
FIG. 5 shows an array configuration comprising a matrix of memory cells according to the invention.

FIG. 5 shows an array configuration comprising a matrix of memory cells according to the invention. The memory device comprises an array 100 of memory cells 101 arranged in a matrix configuration of N rows and M columns. The figure shows a matrix of nine memory cells 101 in a N=3 times M=3 matrix for illustration. Each memory cell 101 comprises a memory element comprising a phase change resistor 102, a heater element 103 and a metal oxide semiconductor field effect transistor (MOSFET) 105. The memory elements are addressed using N row selection lines 110, 111, 112, and M column selection lines 120, 121, 122. All M memory elements on the same row are written or read simultaneously, in the so-called line at a time addressing mode.

The resistor and the heater of each memory element are electrically parallel, and connect one of the M column selection lines 120, 121, 122 to the source region 106 of the corresponding MOSFET 105. The MOSFET 105 acts as a switch to selectively access one of the memory elements. The drain region 107 of the same MOSFET 105 is connected to an output line 150. The gate region 108 of the same MOSFET 105 is connected to one of the N row selection lines 110, 111, 112. The signal level applied via the row selection lines 110, 111, 112 to the gate region 108 determines whether the current can flow between the source region 106 and gate region 107 or not, and hence whether the memory elements on the corresponding row are addressed or isolated from the rest of the device. The signal level on each of the M column selection lines 120, 121, 122 then determines whether the memory element is written, erased or read. This method thus selectively reads and writes the individual N×M memory elements.

Figure 6:
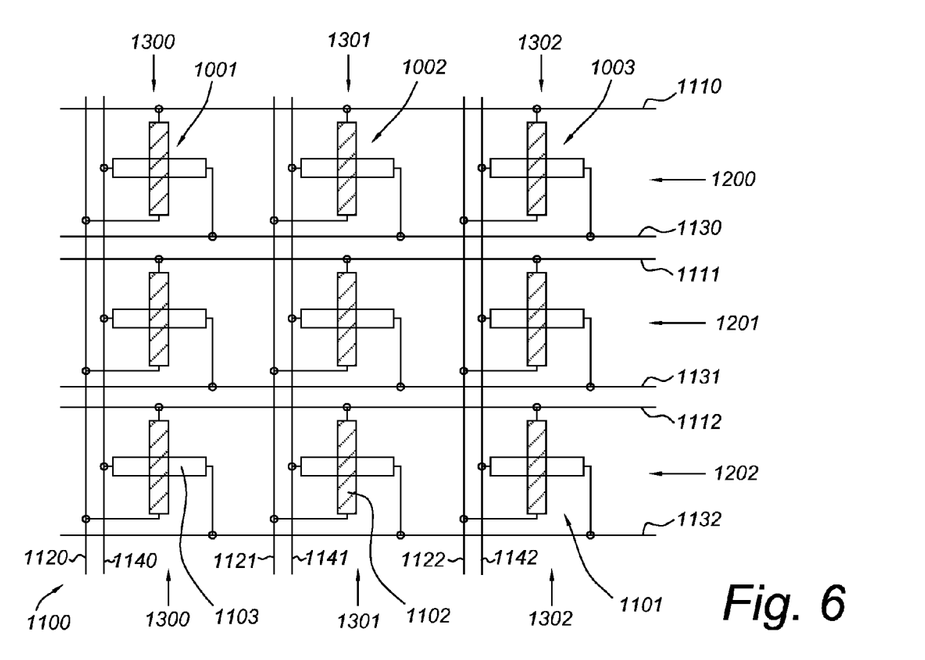
FIG. 6 shows an alternative array configuration comprising a matrix of memory cells according to the invention.

FIG. 6 shows an alternative array configuration comprising a matrix of memory cells according to the invention. The memory device comprising an array 1100 of memory cells 1101 arranged in a matrix configuration of N rows and M columns. The figure shows a matrix of nine memory cells 1101 in a N=3 times M=3 matrix for illustration. Each memory cell 1101 comprises a memory element comprising a phase change resistor 1102 and a heater element 1103. The memory elements are addressed using N PCM row selection lines 1110, 1111, 1112, M PCM column selection lines 1120, 1121, 1122, N heater row selection lines 1130, 1131, 1132 and M heater column selection lines 1140, 1141, 1142. All M memory elements on the same PCM row selection line are written or read simultaneously, in the so-called line at a time addressing mode. The resistor of each memory element electrically connects one of the N PCM row selection lines 1110, 1111, 1112 to one of the M PCM column selection lines 1120, 1121, 1122. The heater of each memory element electrically connects one of the N heater row selection lines 1130, 1131, 1132 to one of the M heater column selection lines 1140, 1141, and 1142. The addressing of the heater elements and the phase change resistors is hereby separated in two matrices, i.e., one matrix PCM column selection lines and PCM row selection lines and another matrix of heater column selection lines and heater row selection lines.

For programming a memory element, the PCM row (1110, 1111, 1112) and the PCM column (1120, 1121, 1122) selection line for the corresponding memory element are kept floating, the heater row selection line (1130, 1131, 1132) for the corresponding memory element is kept at zero voltage or grounded, and the memory element is written with its corresponding data by the appropriate programming voltage Vp (for writing) or erase voltage Ve (for erasing) on the heater column selection lines (1140, 1141, 1142) for the corresponding memory element. The other N−1 PCM row selection lines and the other N−1 heater row selection lines are kept floating. E.g., to program the cells 1001, 1002, 1003 of the first row 1200, the PCM row 1110 and the three PCM columns 1120, 1121, 1122 selection lines for the corresponding memory elements 1105, 1106, 1107 are kept floating, the heater row selection line 1130 for the first row 1200 element is kept at zero voltage or grounded, and the memory element is written with its corresponding data by the appropriate programming voltage Vp (for writing, i.e., programming a "1") or erase voltage Ve (for erasing, i.e. programming a "0") on the heater column selection lines 1140, 1141, 1142 for the corresponding memory elements. For example, applying Vp on heater column selection lines 1140 and 1142 and Ve on heater column selection line 1141 programs a "1", "0" and "1" in the three cells on the first row. The other two PCM row selection lines 1111, 1112 and the other two heater row selection lines 1131, 1132 are kept floating.

For reading a memory element, the PCM column selection line 1120, 1121, 1122 for the corresponding memory element is set at the readout voltage Vr and PCM row selection line 1110, 1111, 1112 for the corresponding memory element is kept at zero voltage or grounded. The other N−1 PCM row selection lines 1110, 1111, 1112 are kept floating. All heater row selection line 1130, 1131, 1132 and all heater column selection lines 1140, 1141, 1142 are kept floating. E.g., for reading the memory elements on the first row 1200, the PCM column selection lines 1120, 1121, 1122 for the memory elements on that row 200 are set at the readout voltage Vr and the PCM row selection line 1110 for the corresponding memory element is kept at zero voltage or grounded. The other two PCM row selection lines 1111, 1112 are kept floating. All heater row selection lines 1130 and all heater column selection lines 1140, 1141, 1142 are kept floating.

Figure 7A:
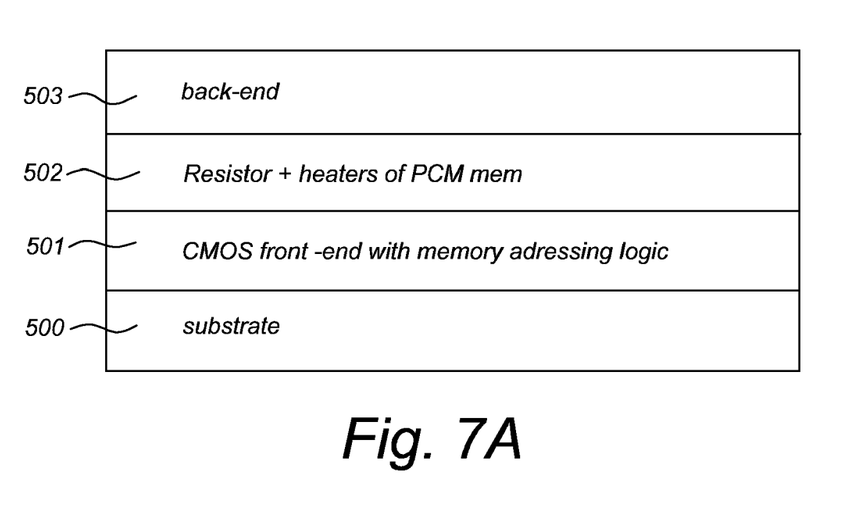
FIG. 7A shows a cross section of an embodiment of a semiconductor device according to the present invention.

FIG. 7A shows a cross section of a semiconductor device according to the invention. The semiconductor device comprises a memory device comprising an array configuration according to the invention implemented in a front-end CMOS process. All CMOS logic as well as the addressing structure for the phase change memory array are implemented in the CMOS front end layers 501, which are directly applied on the silicon substrate 500. The phase change material resistor and heaters are applied next 502. The final back-end processing 503 is then applied on top of this structure.

Figure 7B:
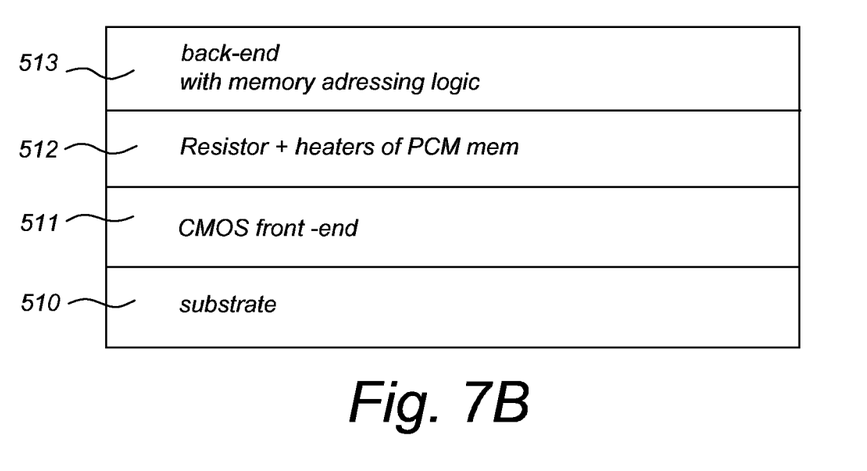
FIG. 7B shows a cross section of an alternative embodiment of a semiconductor device according to the present invention.

FIG. 7B shows a cross section of a semiconductor device in another embodiment the invention. The semiconductor device comprises a memory device comprising an array configuration according to the invention implemented in a back-end CMOS process. CMOS logic is implemented in the CMOS front end layers 511, which are directly applied on the silicon substrate 500. The phase change material resistor and heaters are applied next 502. The final back-end processing 513 is then applied on top of this structure and include also the addressing structure for the phase change memory array. Such a device structure is thus very area efficient, whereas for prior art devices, the memory elements and their addressing structure take a large fraction of the whole device area while leaving only limited or no area where further logic circuits can be created.

This invention is especially useful for (embedded) memory applications. It allows good integration in a CMOS device, and is especially attractive when applied at the back-end. It can replace the flash memory elements in an integrated circuit, but can also be used as SRAM and/or DRAM.

It should be noted that the above-mentioned embodiments illustrate rather than limit the invention, and that those skilled in the art will be able to design many alternative embodiments

The invention claimed is:

1. A memory device, comprising:
an array of memory cells, each memory cell comprising a respective memory element; and
a grid of selection lines, comprising a plurality of first selection lines and a plurality of second selection lines;
each memory cell being individually addressable via one of the first selection lines and one of the second selection lines, wherein the memory element comprises an electric device comprising:
a resistor comprising a phase change material being changeable between a first phase and a second phase within a switching zone, the resistor having a first electrical resistance when the phase change material is in the first phase and a second electrical resistance, different from the first electrical resistance, when the phase change material is in the second phase, the resistor being capable of conducting a first current and the device comprising a heating element adapted to conduct a second current for enabling a transition of the phase change material from the first phase to the second phase within the switching zone of the resistor, characterized in that, the resistor is arranged as a first line and the heating element is arranged as a second line, the first line being adapted to conduct the first current and the second line being adapted to conduct the second current, wherein the first line and the second line cross at a cross position of the switching zone;
wherein the grid of selection lines further comprises a plurality of third selection lines, and a plurality of fourth selection lines, the resistor of each memory element being arranged for electrically connecting one of the first selection lines to one of the second selection lines, and the heating element of each memory element being arranged for electrically connecting one of the third selection lines to one of the fourth selection lines, each heating element being individually addressable via one of the third selection lines and one of the fourth selection lines.

2. A memory device according to claim 1, wherein the first line and the second line being electrically isolated from each other.

3. A memory device according to claim 1, wherein the first line and the second line cross substantially perpendicularly.

4. A memory device according to claim 1, wherein the heating element comprises a metal.

5. A memory device according to claim 4, wherein the metal comprises one selected from a group of copper, aluminum and tungsten.

6. A memory device according to claim 1, wherein the heating element comprises at least a first layer and a second layer and wherein the resistor comprises a third layer of phase change material, and wherein the first layer is positioned between the second layer and the third layer, the first layer being an electrical isolator.

7. A memory device according to claim 6, wherein the second layer is a thermal and electrical conductor.

8. A memory device according to claim 6, wherein the first layer comprises silicon.

9. A memory device according to claim 8, wherein said silicon in the first layer comprises undoped silicon.

10. A memory device according to claim 7, wherein the second layer comprises a silicide compound.

11. A memory device according to claim 10, wherein said silicide compound in the second layer consists of salicided silicon.

12. A method for programming a memory device according to claim 1, comprising:
setting all first selection lines floating;
setting all second selection lines floating;
setting all third selection lines floating;
setting the third selection line for a corresponding memory element of the array of memory cells at zero voltage or ground voltage, and
writing data into the corresponding memory element by application of a voltage of the appropriate level on the fourth selection lines.

13. A method for reading a memory device according to claim 1, comprising:
setting a first selection line for a memory element of the array of memory cells at zero voltage or ground voltage,
setting all other first selection lines floating,
setting all second selection lines at a readout voltage,
setting all third selection lines floating, and
setting all the fourth selection lines floating.

14. A semiconductor device, comprising a memory device according to claim 1.

15. Method of manufacturing a semiconductor device according to claim 14, comprising formation of the grid of selection lines of the memory device in a back-end process.

16. A memory device according to claim 1, wherein the first selection lines and the second selection lines are arranged as a first matrix, and wherein the third selection lines and the fourth selection lines are arranged as a second matrix.

17. A memory device according to claim 1, wherein the first selection lines and the third selection lines are parallel to each other, and wherein the second selection lines and the fourth selection lines are parallel to each other.

* * * * *